United States Patent [19]

Santoro

[11] 4,194,403
[45] Mar. 25, 1980

[54] PUSH-BUTTON OPERATED DEVICE FOR STORING A PLURALITY OF POSITIONS OF A MOVABLE MEMBER

[75] Inventor: Giovanni Santoro, Rome, Italy

[73] Assignee: Werbetronic AG, Maureen Liechtenstein, Italy

[21] Appl. No.: 808,625

[22] Filed: Jun. 21, 1977

[30] Foreign Application Priority Data

Jun. 25, 1976 [IT] Italy .................................. 50161 A/76
May 18, 1977 [IT] Italy .................................. 49462 A/77

[51] Int. Cl.² ............................................... F16H 35/18
[52] U.S. Cl. .................................. 74/10.33; 74/10.37; 334/7
[58] Field of Search ................ 74/10.29, 10.31, 10.33, 74/10.35, 10.37; 334/7

[56] References Cited

U.S. PATENT DOCUMENTS

| 2,253,433 | 8/1971 | Kellogg | 74/10.37 |
| 2,289,513 | 7/1942 | Mastney | 74/10.29 X |
| 2,973,664 | 3/1961 | Williams | 70/10.33 X |
| 3,233,470 | 2/1966 | Spakman et al. | 74/10.33 |
| 3,596,217 | 7/1971 | Chesney | 334/7 |
| 3,946,344 | 3/1976 | Wilkinson | 70/10.33 X |

FOREIGN PATENT DOCUMENTS

| 2446401 | 10/1975 | Fed. Rep. of Germany | 334/7 |
| 1203296 | 8/1970 | United Kingdom | 334/7 |

Primary Examiner—Thomas J. Holko
Attorney, Agent, or Firm—Schwartz, Jeffery, Schwaab, Mack, Blumenthal & Koch

[57] ABSTRACT

A push-button controlled device is provided for storing a number of preselected positions of a control member controlling the variable condition of a second device such as an electrical circuit.

A plurality of push button units are operable both for storing a position of the control member and for selecting the stored position.

12 Claims, 11 Drawing Figures

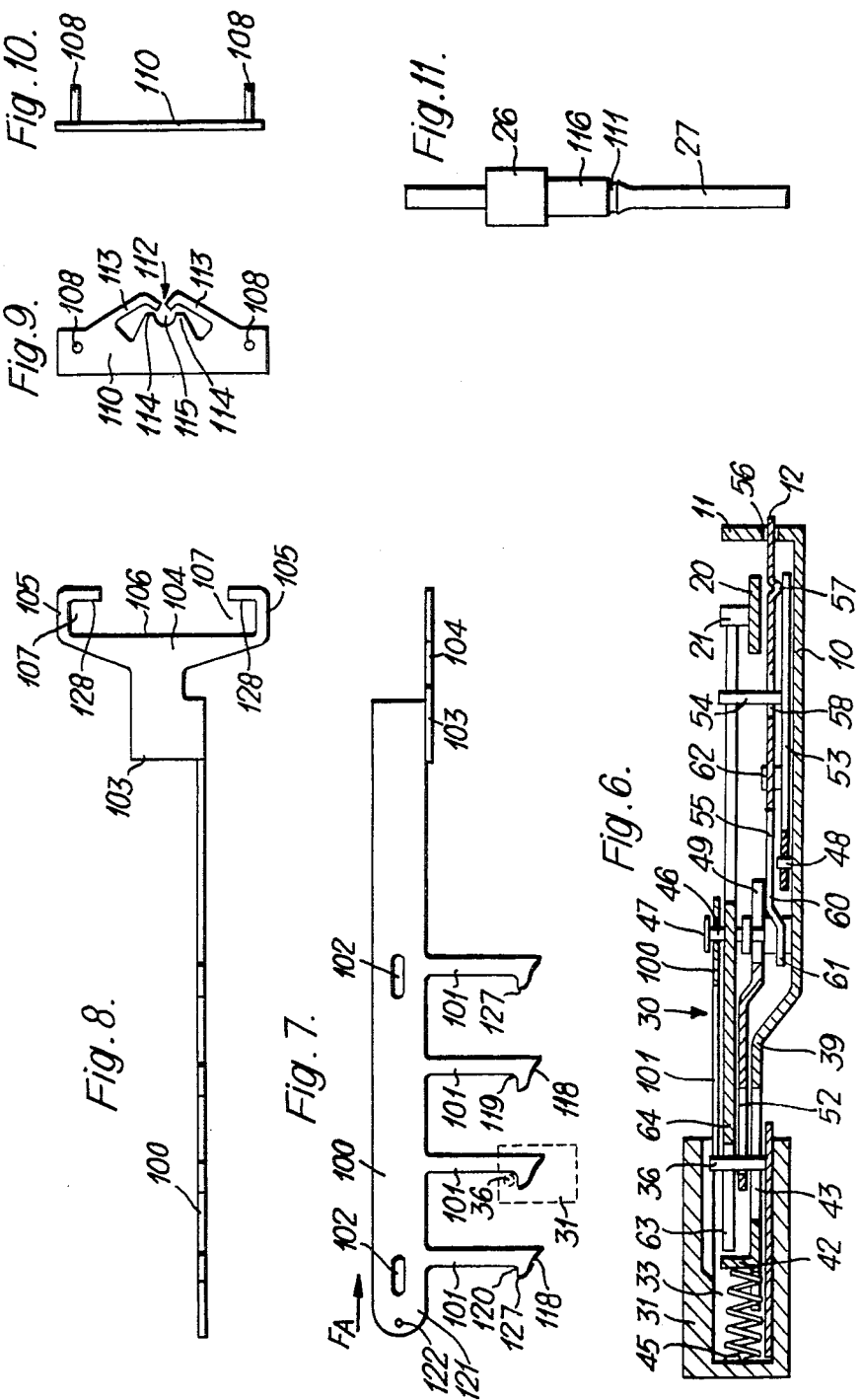

PUSH-BUTTON OPERATED DEVICE FOR STORING A PLURALITY OF POSITIONS OF A MOVABLE MEMBER

This invention relates to a push-botton controlled device for storing a number of preselected positions of a control element which, in turn, controls a member, such as an electrical circuit, having varying characteristics depending on the position of the control element. Owing to the costructural characteristics, thereof such a device is particularly suitable to act as a device for mechanically tuning a radio-apparatus, provided with a tuning circuit, on a number of different frequencies by means of a plurality of push-bottons, the tuning being obtained by depressing the push-botton associated with the desired frequency, appropiately preselected in the device.

Mechanical devices are known by means of which it is possible to preselect, the tuning of a radio receiver on a plurality of preselected frequency values, e.g. the frequency values corresponding to selected broadcasting stations of usual listening, this being obtained by storing.

These devices make use of different push-botton controlled mechanisms by which different broadcasting stations can be selected and possibly changed.

However, even if known devices generally answer the purpose, they lack in accuracy and have a bulky configuration; accordingly they cannot be easily comprised in small radio-apparatuses such as a car radio set.

Moreover they are very complex and then costly.

In addition thereto, owing to the reduced accuracy, known devices generally need adjustment mechanisms which further complicate the structure, adjustment thereof and contribute to highly increasing the costs.

On the contrary, this invention provides a device of the above mentioned type in which a high operation accuracy is joined to a compact, simple and cheap structure which, furthermore, eliminates the need of calibrating procedures during production, which are very costly.

It is therefore a main object of the invention to provide a push-botton controlled device adapted to store a plurality of preselected positions of a movable control element, each of said positions being selectable by means of a push-botton, which device is of a compact and simple configuration and has an accurate and reliable operation.

It is another object of the invention to provide such a device that, owing to the miniaturised size thereof, can be used in all radio receivers in which it is essential to minimize the bulk of all devices included therein, in order to mimimize the overall size thereof.

It is still a further object of the invention to provide a device in which the need of adjustment or calibration procedures during production is eliminated.

It is a correlated object of the invention to provide another embodiment of the device, provided with a retaining unit for maintaining each depressed push-botton in a depressed position, different from the retaining means included in the first embodiment and particularly suitable for use in very compact receivers.

According to the invention, unlike the art almost universally adopted heretofore, the storing elements, controlled by the push-bottons and in the same number as the latter, are placed externally of the corresponding push-botton instead of being received therein.

As it will be appreciated from what follows, such arrangement allows maximum miniaturization of the storing device, making it possible to provide a device adapted to store a number of positions with maximum efficiency and reliability, yet having a highly reduced size, particularly as regards the thickness and width thereof.

The invention will be now described in more detail with reference to the annexed drawings showing, as an illustrative example, a device used as a tuning push-button unit for preselecting six broadcasting stations in an electromagnetic wave receiving radio-apparatus, as well as a second embodiment of the device provided with a different means for maintaing each depressed push-button in its depressed position.

In the drawings:

FIG. 3 is an enlarged sectional view along line III—III of FIG. 1;

FIG. 4 is an enlarged view showing in detail the particular configuration of an operating element of the device according to the invention;

FIG. 6 is a sectional view along line VI—VI in FIG. 5;

FIG. 7 is a top view of the retaining member of the retaining means;

FIG. 8 is a side view of the member of FIG. 7;

FIG. 9 is a side view of the friction plate;

FIG. 10 is a side view of the plate in FIG. 9, and

FIG. 11 is a view showing the shaft of the tuning handle, in detail.

Figure 1:
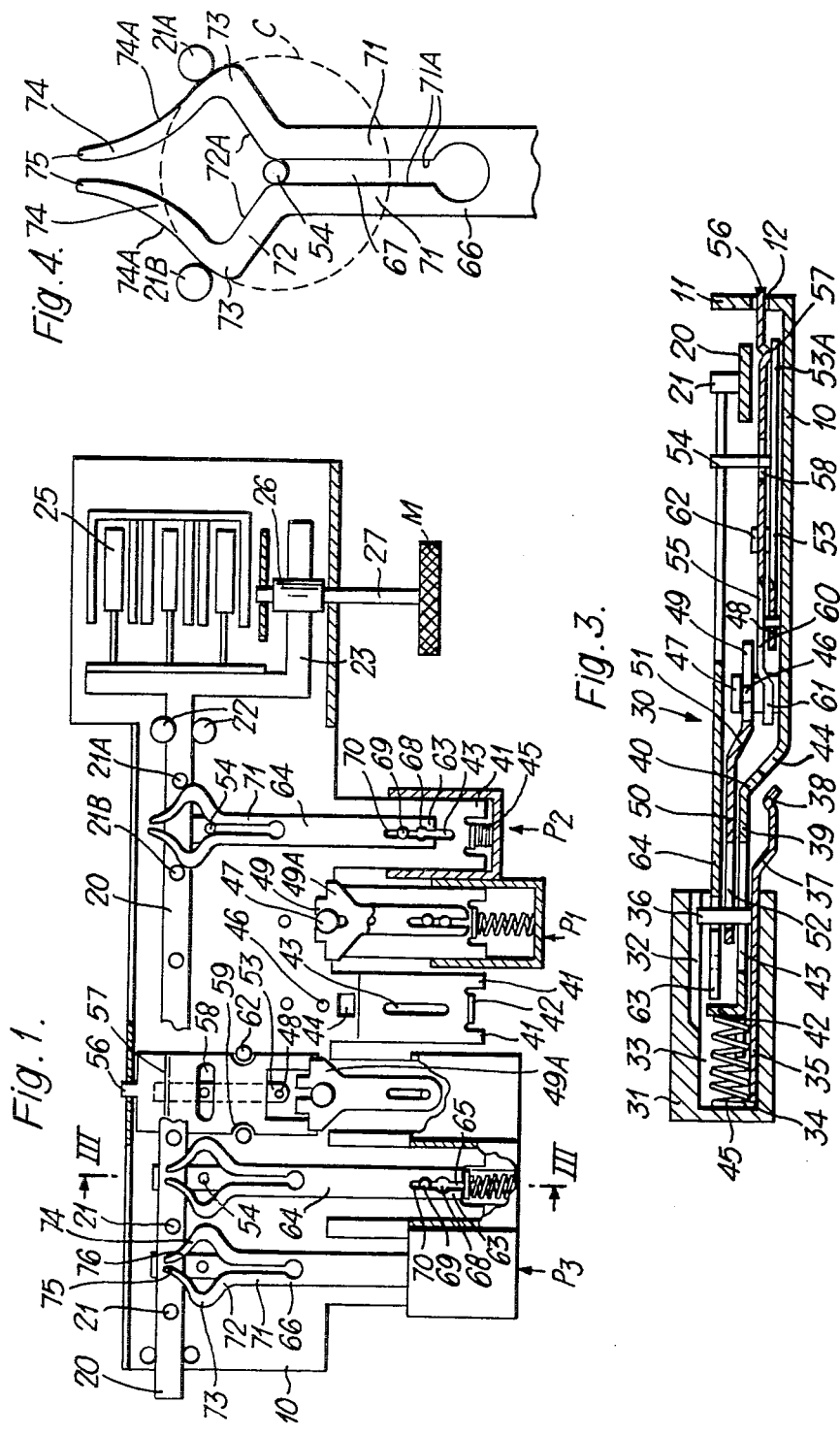
FIG. 1 is a top view of the device according to the invention with portions omitted or broken-away for sake of clarity.
Figure 2:
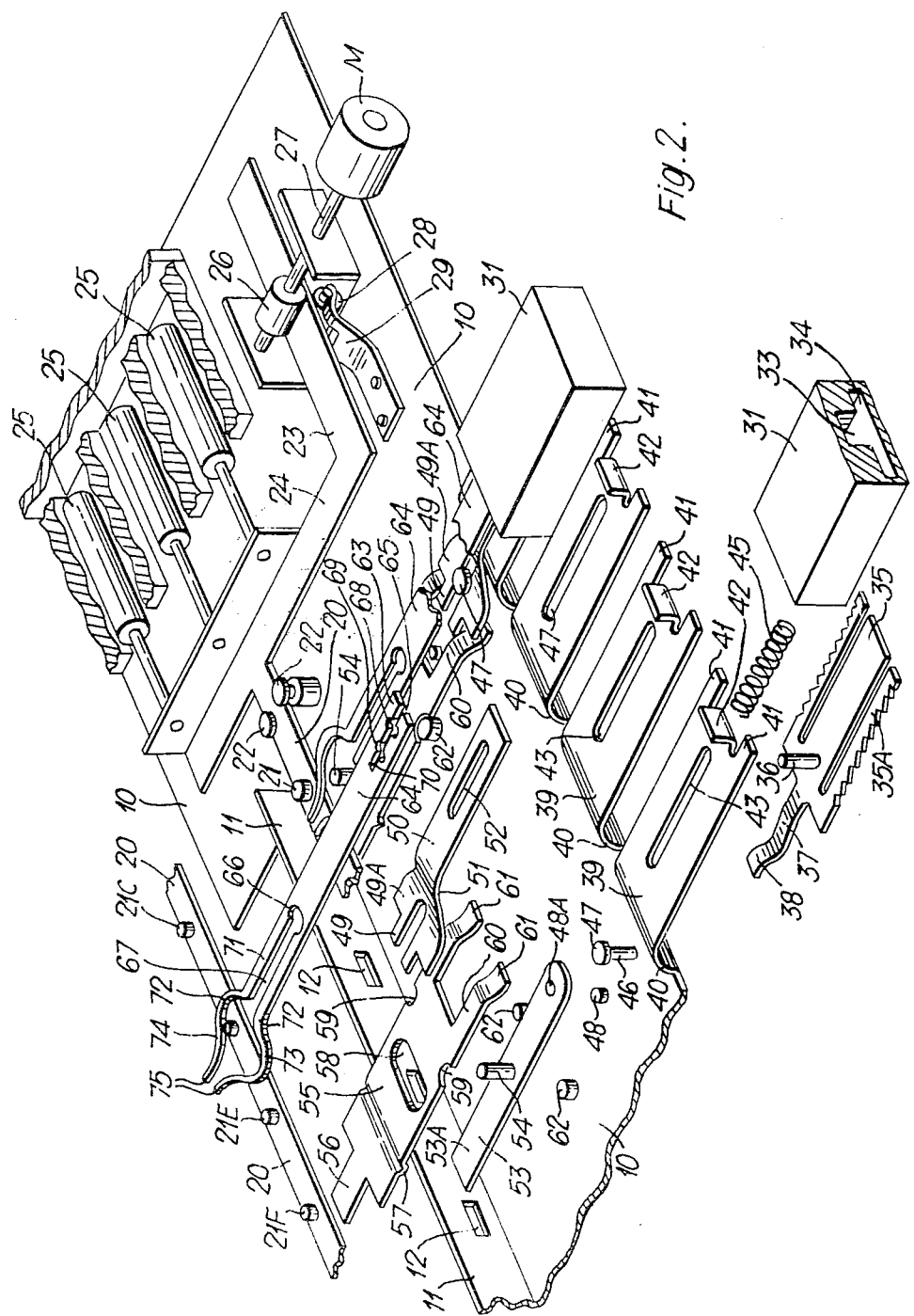
FIG. 2 is a perspective, partially exploded view with portions omitted or broken away.

With reference to FIGS. 1 and 2 the first embodiment of the device according to the invention comprises a supporting plate 10 integral with the framework of the receiver having a rear wall 11 and six push-button controlled tuning units 30, identical with each other acting on a common control rod 20. Common control rod 20 is provided with seven equally spaced pins 21 (A, B . . . G), and is appropriately connected to the tuning device of the receiver, which is represented by tuning cores 25. Wall 11 is provided with aligned openings 12.

Each unit 30 is adapted to store one previously selected position of control rod 20 and then of tuning device 25 connected, thereto and to find out the preselected position, it is to say that operation of each unit 30 carries control rod 20 to the position previously stored therein and then tuning device 25 is set to the broadcasting frequency, associated to the said position.

To this purpose, each unit 30 comprises a push button 31 having a cavity 32 of rectangular section therein extending with a rear cavity 33 of smaller section and enlarging downwardly at 34, as shown in FIG. 2.

A plate 35 is received in the bottom of enlarged portion 34 and it is firmly connected thereto, for example by serration 35A exerting a holding action on the side walls of cavity 34.

Plate 35 is provided with an upstanding pin 36 and a central finger 37, extending outwardly from push-button 31 and slightly arcuate downwardly, having an upwardly arcuate portion 38 at its free end received in enlarged portion 34.

The end of a flange 39 is received in enlarged portion 34, just above plate 35.

Flange 39 is integral with supporting plate 10 and at a slightly higher level with respect thereto and comprises an S-shaped portion 40.

Flange 39 has two side fingers 41 at the free end thereof with an upwardly extending tab 42 therebetween; a central slot 43 for receiving pin 36; and a square window 44 in S-shaped portion 40.

A compression coil spring 45 is located in cavity 33 of push-button 31, acting between the cavity bottom and the outer face of tab 42.

Furthermore, a first pin 46 with head 47 and a pin 48 spaced therefrom inwardly of plate 10 are integral with plate 10 in correspondence with each flange 39 and aligned with the extension of the longitudinal axis thereof.

The end of a holding-releasing lever 50 is engaged under head 47 of pin 46.

Lever 50 is slightly arcuate at 51 and pivoted through slot 52 on pin 36 within cavity 32. The end of lever 50, engaged under head 47, is forkshaped and comprises two fingers 49 each having a laterally extending tab 49A.

Holding-releasing lever 50 exerts a holding and releasing action on the stopping member of the tuning unit, which comprises an elongated plate 53 secured to pin 48 at one end and having an upstanding storage pin 54. Holding and releasing of storage member 53 is performed by means of an intermediate lever 55 which comprises: a plate having, a tongue 56, inserted into an opening 12 of wall 11 at one end; a downwardly transversal rib 57; a central elongated transversal window 58 and two semicircular notches 59 on the side edges thereof. The opposite end of lever 55 is fork shaped and has two parallel side fingers 60, each having a downwardly arcuate end 61 and being placed laterally of headed pin 46 under tabs 49A of fingers 49 of lever 50.

It is to be noted that pins 62 integral with plate 10 and received in notches 59, hold plate 55 with respect to axial and lateral movements.

Rear end 63 of the actuating member 64 of tuning unit is received in the upper portion of cavity 32 of push button 31.

Actuating member 64, when suitably operated, selects the position of storing member 53 and then, once this position has been set, it selects the relative position of control rod 20 and accordingly the relative frequency of tuning device 25.

Member 64 comprises an elongated plate of a suitable metal having a slot 65 at the rear end 63 and a front portion having two fingers 66.

Rear slot 65 has a first open portion, two spaced openings 68 and 69 and an end portion 70.

Fingers 66 comprise a first straight portion 71 and then diverge with a pincers shaped portion, each finger having an outwardly directed portion 72, an arcuated portion 73, an inwardly directed portion 74 and a sharp end or tip 75, the two tips 75 being slightly spaced from each other.

With such a construction, fingers 66 have various cam-shaped surfaces which, as illustrated in detail hereinafter, will be used for positioning storage pin 54 of tuning unit 30 with respect to the corresponding pair of pins 21A and 21B (or 21B and 21C, and so on) integral with tuning control rod 20.

These cam shaped surfaces, which are better shown in detail in FIG. 4, have inner surfaces 71A of straight portions 71, inner surfaces 72A of diverging portions 72 and outer surfaces 74A of converging portions 74 adjacent arcuated portion 73.

At this point it should be noted that, in all members, surfaces 74A form an arc of circumference C, the centre of which is a point located exactly at the mouth of slot 67 defined by parallel and spaced portions 71 of fingers 66, this point being on the axis of storage pin 54 when tuning unit 30 is carried to the position selecting a position of control rod 20 and, accordingly, a given frequency of the receiver.

Finally the device of the invention is provided with pairs of pins 22, integral with plate 10, in order to guide control rod 20, and knob M mounted on the receiver framework for manually tuning the receiver. Knob M controls the position of control rod 20 through a pair of rollers comprising roller 26, driven by shaft 27 of knob M, and roller 28 pushed towards roller 26 by a flat spring 29. Side extension 23 of tuning rod 20 is engaged between rollers 26 and 28, and is connected to rod 20 by transversal arm 24 to which tuning devices 25 are firmly connected.

It should be noted that the unit comprising rollers 26 and 28 and flat spring 29 is such as to form a friction device allowing control rod 20 to move with respect to manual control knob M independently thereof.

The operation of the device according to the invention will be now described in respect to the selection of a station broadcasting on a given frequency, this station being of usual listening and receivable by the receiver to which the device is associated; the storage of that station or frequency in one tuning unit 30; and the automatic selection of that station by depressing push-button 31 of the one unit 30.

First of all the radio-apparatus will be manually tuned on said broadcasting station by means of knob M.

Then push button 31 will be pulled out of that tuning unit 30 in which that station is to be "stored" until it will reach the position indicated at P1 in FIG. 1. This operation will move back both plate 35, integral with push button 31, and holding-releasing lever 50 which is moved back by pin 36 abutting against the rear edge of slot 52.

Moving back of lever 50, will release end 61 of intermediate lever 55, on which tabs 49A of fingers 49 rest, and accordingly, rib 57 will no longer press against end 53A of member 53, which will be able to rotate on plate 10 about pin 48.

Meanwhile, owing to its back movement, pin 36 will reach rear opening 68 of slot 65 of member 64, the rear end 63 of which will stop against the inner face of tab 42 of flange 39 integral with fixed plate 10.

Then, in order to set the position of control rod 20, the push-button 31 previously extracted will be completely depressed to position P2 (FIG. 1). This operation will cause plate 35 and pin 36 to move forward and pin 36 will move accordingly both operating member 64 and holding-releasing lever 50. Now, the displacement of control rod 20 and the position thereon of pins 21 (A, B . . . G) are such that the relative positions of fingers 66 and pairs of pins 21A, 21B, and the like, always cause outer surface 75A of one finger 66 to engage one pin 21 (in this case 21A or 21B), during the first portion of the forward movement of operating member 64. Since control rod 20 is now stationary (because the knob-rod coupling is of the non-reversible drive type and the friction device exerts a relevant force), sloped surface 75A will slide against one pin, e.g. pin 21A, this causing member 64 to rotate counterclockwise about pin 36. In the meantime, the forward movement of member 64 has carried the upper portion of storage pin 54 of storing member 53 to abut against inner surface 72A of finger 66. Inner surface 72A, acting as a cam, will move pin 54 laterally thus causing member 53 to rotate in this istance to rotate counterclockwise, which member 53 at this moment is not fastened by rib 57 of intermediate lever 55.

The further forward movement of push button 21, and accordingly of actuating member 64, will cause external surface 75A of second finger 66 to engage pin 21B, and storage pin 54 to reach the beginning of slot 67 between inner surfaces 71A of straight portions 71. In this position further forward movement of operating member 64 is stopped and a further movement of push button 31 causes pin 36 to snap from opening 68 to opening 69. This further movement carries also tabs 49A of fingers 49 of holding and releasing lever 50 to urge downwardly the end of intermediate lever 55 which will lower, since tab 56 rotates about the upper edge of window 12, and accordingly rib 57 will urge downwardly end 53A of storing member 53, thus fastening the same in position against plate 10.

Moreover, the upwardly arcuate end of finger 37 of plate 35 will hook in the upper side of window 44 of tab 39, thus maintaining push button 31 in the advanced position against the bias of spring 45.

Evidently, any of the other push button controlled units 30 can be similarly operated in order to preselect the automatic selection of the other stations therein.

From the foregoing it will be appreciated that, once the automatic selection of a determined station has been preselected in one push button controlled unit 30, the receiver will be automatically tuned on that station by depressing the corresponding push button.

As a matter of fact, depressing for example push button 31, corresponding to position P1 in FIG. 1, will cause operating member 64 to move forward. Consequently, inner surface 72A of one finger 66 will engage the upper portion of storage pin 54. Since relative member 53 is held by rib 57, storing pin 54 will force member 64 to rotate about pin 36 until pin 54 reaches the entry of slot 67 as illustrated above. However in the meantime, one tip 75 of fingers 66 has engaged one pin 21A (of 21B depending on the position of control rod 20) and accordingly the rotation of member 64 will cause control rod 20 to move longitudinally, this translation being possible owing to the friction device comprising rollers 26 and 28. Rod 20 will stop only when pins 54, 21A and 21B and surfaces 71A and 74A have reached exactly the position of FIG. 4.

Now it is useful to note and particularly appreciate the configuration of fingers 66 of operating member 64, shown in FIG. 4. Owing to this configuration when at the mouth of slot 67, pin 54 is the centre of a circumference, two arcs of which are materialized by surfaces 74A of fingers 66 which position pins 21 (in this case 21A and 21B).

Accordingly, operation of the device is extremaly accurate, as in automatically tuning the radio-apparatus through a push button controlled unit 30, the relative position of storage pin 54, in respect to the pair of pins 21 (A, B . . . G) engaged by the corresponding operating member 64 (and accordingly the position of control rod 20), is always identically defined with maximum accuracy for any angular position of operating member 64 in respect to the axis of relative tuning unit 30.

It must be further pointed out that a lateral movement of control rod 20 from the position selected either by means of knob M or operating a different tuning unit, will result in the movement to the rest position of the one of push buttons 31 which has been previously depressed and held in the depressed position. As a matter of fact, this lateral movement will force pins 21A and 21B to push back corresponding member 64 that will exert a force on pin 36 and, accordingly, on push button 31, thus disengaging arcuated end 38 from window 44 and moving push button 31 to the rest position (P3 in FIG. 1) under the bias of spring 45.

In FIGS. 5 to 11 another embodiment of the device of FIG. 1 to 4 is illustrated, provided with a retaining unit for the depressed push buttons particularly useful in very compact radio-receivers.

Figure 5:
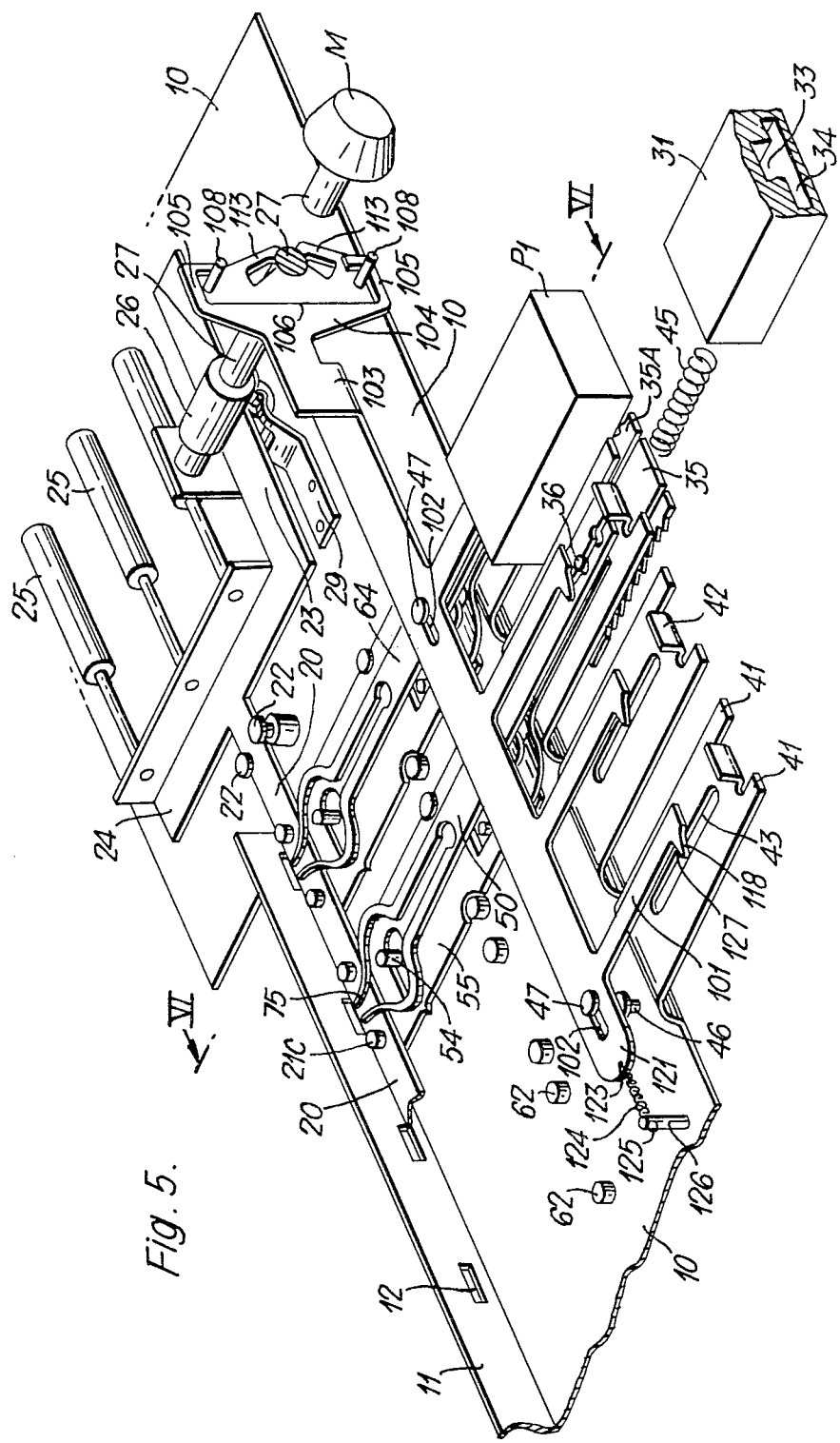
FIG. 5 is a perspective view of a second embodiment of the device of FIG. 1 provided with different retaining means for the depressed push-buttons.

With reference to FIGS. 5 and 6 it can be seen that an elongated rectangular plate 100 is transversally mounted above members 64, plate 100 having a plurality of laterally extending teeth 101, each tooth corresponding to one push button controlled unit 30.

Plate 100 is engaged on pins 46, suitably extended, below the head 47 thereof, by means of two slots 102. Plate 100 is provided with a "head" 103 at the right end thereof in the drawing. Head 103 is at right angles to the plate body 100, which accordingly shows an L-shaped section in correspondence with this head.

End portion 104 of head 103 is pincers-shaped having two C-shaped arms 105 protruding from a straight edge 106.

Each notch 107, defined by straight edge 106 and corresponding pincers-shaped arm 105, receives a pin 108, both pins being integral with a plate 110 supported on shaft 27 of manual control tuning knob M.

More specifically plate 110 is received on a groove (FIG. 11) of shaft 27 by jaw-shaped portion 112 thereof comprising two outer embracing fingers 113 and two inner fingers 114, defining together a circular opening 115 of a slightly lesser diameter than the diameter of length 116 of shaft 27 (FIG. 7) forming groove 111.

As clearly seen in FIGS. 5 and 7, each tooth 101, the end of which is received in the corresponding push button 31, has a straight right edge and a double slope shaped left edge, i.e. a leading slope 118 and a trailing hooking profile comprising a first hooking portion 119 and a second sloped portion 120.

With such an arrangement, depressing a push button, such as push button P1 in FIG. 2, besides all the other actions illustrated in connection with the operation of the device described above, will cause pin 36 to urge against inclined slope 118. Accordingly, plate 100 will be forced to move laterally along arrow FA (FIG. 7) against the bias of spring 124, until pin 36 has passed point 127 of the tooth, and then plate 100 will reach again its rest position under the bias of the coil spring 124.

Accordingly, during the return stroke of the push button occurring under the bias of spring 45, once the pressure thereon has been removed, pin 36 will engage hooking portion 119 of the tooth, holding the depressed push button in a depressed position.

Pin 36 will be released from hook 119 as soon as plate 100 is moved again along arrow FA either owing to the action of another pin 36 upon depressing of the corresponding push button, which pin 36 will act on the sloped portion 118 of the tooth 101 associated thereto, or owing to any rotation of a given extent of tuning knob M, and then of plate 110 which will rotate bodily with shaft 27 owing to the friction of jaw 112 on portion 116 thereof.

Indeed such a relevant rotation will cause one or the other pin 108 to push against inner edge 128 of corresponding arm 105 (FIG. 4).

It will be appreciated that also in this case, under the action of one of the pins, plate 100 will move along arrow FA against the bias of spring 124 thus releasing any pin 36 engaged against hooking portion 119 of relative tooth 101 while any further manual rotation of shaft 27 for the tuning of the receiver will take place owing to the frictional rotation of shaft 27 within opening 115 of jaw 112 of plate 110.

It will be also appreciated that, on the contrary, small rotations of knob M, possibly required after depression of a push button in order to adjust the tuning, will not cause corresponding pin 36 to be released from the tooth 101, owing to the clearance between pins 108 and abutment edge 128.

It will be noted that the unit herein described and illustrated for holding in the depressed position any push button of the device according to the invention, can comprise a plate oppositely shaped in respect to the previously illustrated plate 101 and more specifically a plate having teeth 101 oppositely directed.

In this case the direction of the action of spring 124 would be inverted and pins 108 would act on straight edge 106 of head 103, while arms 105 would act on these pins thus resetting the position of friction plate 110.

Finally, it should be noted that, in the push button controlled devices provided with the holding unit described with reference to FIGS. 5 and 11, plates 35 are not provided with portions 37 which were the means for stopping the push button in the depressed position in the device described with reference to FIGS. 1 to 4.

From the foregoing it will be appreciated that the objects of the invention are satisfactorily reached by the devices described above.

It is understood that modifications and changes can be made to the parts and a combinations of parts as described with reference to the annexed drawings, without departing from the scope and concepts of the invention.

I claim:

1. A push button controlled device for storing a plurality of positions of a movable member thereof, the position of said member controlling the variable condition of a second device mechanically connected thereto, and said positions of said movable member being preselected through said push buttons and selected by the latter when depressing the corresponding push button, said device comprising: a supporting plate said movable member (20) being slidingly supported on the plate and said movable member having a plurality of pairs of pins mounted thereon for enabling selection of said positions; a control unit (M) for manually controlling the positions of said movable member; a friction device allowing relative movements between said movable member and said manually operated control unit; and a plurality of storing and selecting units provided with said push buttons and having means for storing and selecting said positions of said movable member, said means being adapted to cooperate with said plurality of pairs of pins of said movable member.

2. The device according to claim 1, wherein said storing and selecting means of each push-button controlled unti comprises: a stored member (53) having one end pivotally mounted and provided with a storage pin (54) at the opposite free end, and an operating member (64) having one end pivotally received in the corresponding push button of said unit and the opposite end formed by two fingers spaced by a slot, which fingers, acting on said storage pin and being guided by said pair of pins of said movable member, set the position of said storing member, both during storage of a preselected position of said movable member and selection of said position, and move said movable member back to the stored position, said device being characterized in that the structure and the configuration thereof is such that, in both the positions of storage of a position of said movable member and selection of said stored position of the movable member, the axis of said storage pin is the center of an arc substantially tangent both to the pins of said pair of pins for selecting the position of said movable member and to the outer surface of each of said two fingers of the operating member which engages said pair of pins.

3. The device according to claim 2, wherein in said storage and selection positions of each push-button controlled unit, said storage pin is at the mouth of said slot separating said two fingers of said operating member, said slot being, at least in that point of a width equal to the diameter of said storage pin.

4. The device according to claim 3, wherein said two fingers are pincers-shaped and each finger comprises a straight portion, an outwardly directed portion, an arcuate portion, an inwardly directed portion and a tip, said two outer surfaces of said fingers coinciding with said arcs having the center thereof on said storage pin and forming the outer surface of said inwardly directed portion adjacent said arcuate portion.

5. The device according to claim 1, further comprising a tab corresponding to each of said push-button controlled units for supporting same, said tabs integral with said supporting plate and said device further comprising with each push-button controlled unit for storing and selecting the positions of said movable member, also a mechanism for holding said unit in the depressed position of storage and selection, said holding mechanism acting against the bias of a return spring forming part of said push button, said holding mechanism comprising: a plate (35) received in a cavity of the push button and secured thereto, and provided with an upstanding pin (36) and a central finger having an upwardly arcuate free end and protruding from the push button below the corresponding tab integral with said supporting plate, said tab having an aperture therein and said upwardly arcuate end passing through said aperture and engaging said tab and being automatically disengaged therefrom upon backward movement of said push-button.

6. The device according to claim 2 wherein each push button controlled unit for storing and selecting the position of said movable member comprises: a clamping and releasing mechanism adapted to release said storing member in the pulled-out position of said push button and to clamp said storing member in the rest, selection and storage positions of said push button, said mechanism comprising a clamping and releasing lever (50) having a slot fitted on a pin (36) provided on said push button in order to move back therewith, and two fingers (49) provided with a side tab (49A); a pin (46) integral with said supporting plate and an intermediate lever (55) having an end tab (56) received in an opening of a wall integral with said supporting plate, a downwardly directed rib (57) abutting on the free end of said storing member (53), and two fingers (61) each placed under one of said side tabs of said fingers of the clamping and releasing lever, so that said intermediate lever is forced downwardly by said clamping and releasing lever in order to clamp said storing member against said supporting plate by means of said rib when said push button is in the rest and depressed positions, while said intermediate lever can raise and release said storing member when said push button is in the pulledout position and accordingly the back movement of said tabs of said fingers of the clamping and releasing lever disengages the corresponding fingers of said intermediate lever.

7. The device according to claim 1, further provided with a holding unit for said push buttons adapted to hold any push button depressed substantially in the depressed position in respect to the push buttons in the rest position said holding unit comprising: an elongated flat member (100) supported on said supporting plate by means of elements allowing a limited axial movement thereof and provided with toothshaped holding members (101) in the same number as the push buttons, each holding member being fitted in the corresponding push button, and having a pincers-shaped head; a friction plate connected with said elongated flat member and having friction means mounting the friction plate on a knob shaft of said control unit; and a return spring for biasing said elongated flat member; said holding unit cooperating with a pin (36) provided on each of said push buttons of said device, said pin (36) hooked by said tooth-shaped holding member during the return storke of the depressed push button.

8. The device according to claim 7, wherein each tooth of said tooth-shaped holding members comprises: a sloped portion opposing said pin (36) provided on each push button during the depression stroke of a push button in order to laterally move said elongated flat member against the bias of said return spring, thus allowing said pin (36) to pass beyond said tooth and causing any pin (36) corresponding to a previously depressed push button, hooked by the corresponding tooth, to be released.

9. The device according to claim 7, wherein said friction means mounting said friction plate on said knob shaft comprises a jaw having two outer fingers and two inner fingers defining a circular opening, receiving a portion of said knob shaft, said portion having a diameter reduced in respect to said shaft but slightly greater than said circular opening, so that said shaft can only frictionally rotate therein.

10. The device according to claim 1 or 2, wherein said friction device allowing relative movements between said movable member and said manually operated control unit comprises: a flat arm integral with said movable member clamped between a pair of rollers resiliently urged together, one of the rollers being driven by said manually operated control unit.

11. The device according to claim 1, used in combination with a tuning radio-apparatus, the tuning circuit thereof forming said second device.

12. The device according to claim 1 wherein a portion of said movable member extends between opposed friction rollers of said friction device one of said rollers being resiliently urged toward the other roller, and said control unit including manually operable means connected to said othe roller for rotating the same and moving said movable member.

* * * * *